United States Patent
Kadoi et al.

(10) Patent No.: US 11,017,981 B2
(45) Date of Patent: May 25, 2021

(54) CHARGED PARTICLE BEAM SYSTEM

(71) Applicant: HITACHI HIGH-TECH CORPORATION, Tokyo (JP)

(72) Inventors: Ryo Kadoi, Tokyo (JP); Wen Li, Tokyo (JP); Naoya Ishigaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/572,943

(22) Filed: Sep. 17, 2019

(65) Prior Publication Data

US 2020/0090900 A1    Mar. 19, 2020

(30) Foreign Application Priority Data

Sep. 19, 2018 (JP) .............................. JP2018-175123

(51) Int. Cl.
*H01J 37/244* (2006.01)
*H01J 37/20* (2006.01)

(52) U.S. Cl.
CPC ............ *H01J 37/244* (2013.01); *H01J 37/20* (2013.01); *H01J 2237/202* (2013.01); *H01J 2237/24495* (2013.01)

(58) Field of Classification Search
CPC ......... H01J 37/32082; H01J 2237/0206; H01J 37/24; H01J 37/244; H01J 37/32963
USPC .................. 250/310, 311; 324/536
See application file for complete search history.

(56) References Cited

U.S. PATENT DOCUMENTS

| | | | |
|---|---|---|---|
| 7,373,899 B2* | 5/2008 | Sumiya | C23C 16/507 118/723 E |
| 7,771,608 B2* | 8/2010 | Sumiya | H01J 37/32091 216/67 |
| 2007/0181254 A1* | 8/2007 | Iida | H01J 37/32183 156/345.28 |
| 2010/0079148 A1* | 4/2010 | Park | G01R 31/1254 324/536 |
| 2010/0080324 A1* | 4/2010 | Liao | H04L 25/06 375/319 |
| 2014/0295583 A1* | 10/2014 | Nakamoto | H01L 22/26 438/16 |
| 2019/0304737 A1* | 10/2019 | Ogasawara | H01J 37/226 |
| 2020/0090900 A1* | 3/2020 | Kadoi | H01J 37/20 |

FOREIGN PATENT DOCUMENTS

| JP | 2006250870 A | 9/2006 |
|---|---|---|
| JP | 2010085386 A | 4/2010 |

* cited by examiner

*Primary Examiner* — David A Vanore
(74) *Attorney, Agent, or Firm* — Miles & Stockbridge, P.C.

(57) ABSTRACT

A charged particle beam system includes a charged particle beam device 101 and the detection circuit 114. The charged particle beam device 101 includes a first antenna 102 having a first resonant frequency and a second antenna 103 having a second resonant frequency. The detection circuit 114 includes a first amplitude detection unit 110 which detects a first amplitude of a signal after passing a first filter 107, a second amplitude detection unit 111 which detects a second amplitude of a signal after passing a second filter 108, and an amplitude comparison unit 113 which compares the first amplitude with the second amplitude.

10 Claims, 11 Drawing Sheets

| | | DETECTED VOLTAGE PATTERN | | | | |
|---|---|---|---|---|---|---|
| | | ANTENNA 302 | ANTENNA 303 | ANTENNA 304 | ANTENNA 305 | ANTENNA 306 |
| DISCHARGE GENERATION POSITION | POSITION 1 | 1.92 $(=V_{N11})$ | 1.15 $(=V_{N12})$ | 0.77 $(=V_{N13})$ | 0.38 $(=V_{N14})$ | 0.77 $(=V_{N15})$ |
| | POSITION 2 | 0.77 $(=V_{N21})$ | 0.77 $(=V_{N22})$ | 1.92 $(=V_{N23})$ | 0.77 $(=V_{N24})$ | 0.77 $(=V_{N25})$ |
| | POSITION 3 | 0.71 $(=V_{N31})$ | 0.36 $(=V_{N32})$ | 1.07 $(=V_{N33})$ | 1.07 $(=V_{N34})$ | 1.79 $(=V_{N35})$ |

| | ANTENNA 302 | ANTENNA 303 | ANTENNA 304 | ANTENNA 305 | ANTENNA 306 |
|---|---|---|---|---|---|
| POSITION X | 0.65 $(=V_{Nm1})$ | 0.43 $(=V_{Nm2})$ | 1.01 $(=V_{Nm3})$ | 1.19 $(=V_{Nm4})$ | 1.73 $(=V_{Nm5})$ |

FIG. 10A

| | | DETECTED VOLTAGE PATTERN | | | | |
|---|---|---|---|---|---|---|
| | | ANTENNA 302 | ANTENNA 303 | ANTENNA 304 | ANTENNA 305 | ANTENNA 306 |
| DISCHARGE GENERATION POSITION | POSITION 1 | 1.92 (=$V_{N11}$) | 1.15 (=$V_{N12}$) | 0.77 (=$V_{N13}$) | 0.38 (=$V_{N14}$) | 0.77 (=$V_{N15}$) |
| | POSITION 2 | 0.77 (=$V_{N21}$) | 0.77 (=$V_{N22}$) | 1.92 (=$V_{N23}$) | 0.77 (=$V_{N24}$) | 0.77 (=$V_{N25}$) |
| | POSITION 3 | 0.71 (=$V_{N31}$) | 0.36 (=$V_{N32}$) | 1.07 (=$V_{N33}$) | 1.07 (=$V_{N34}$) | 1.79 (=$V_{N35}$) |

FIG. 10B

| COORDINATE OF MOVING STAGE DURING DISCHARGE | | DETECTED VOLTAGE PATTERN | | | | |
|---|---|---|---|---|---|---|
| X | Y | ANTENNA 302 | ANTENNA 303 | ANTENNA 304 | ANTENNA 305 | ANTENNA 306 |
| 0 | 0 | 1.43(=$V_{NS1(0,0)}$) | 0.71(=$V_{NS2(0,0)}$) | 1.43(=$V_{NS3(0,0)}$) | 0.71(=$V_{NS4(0,0)}$) | 0.71(=$V_{NS5(0,0)}$) |
| 5 | 0 | 1.33(=$V_{NS1(5,0)}$) | 0.67(=$V_{NS2(5,0)}$) | 1.67(=$V_{NS3(5,0)}$) | 0.67(=$V_{NS4(5,0)}$) | 0.67(=$V_{NS5(5,0)}$) |
| 10 | 0 | 1.00(=$V_{NS1(10,0)}$) | 0.67(=$V_{NS2(10,0)}$) | 1.67(=$V_{NS3(10,0)}$) | 1.00(=$V_{NS4(10,0)}$) | 0.67(=$V_{NS5(10,0)}$) |
| ⋮ | | | | | | |
| 0 | 5 | 0.94(=$V_{NS1(0,5)}$) | 0.94(=$V_{NS2(0,5)}$) | 1.56(=$V_{NS3(0,5)}$) | 0.94(=$V_{NS4(0,5)}$) | 0.63(=$V_{NS5(0,5)}$) |
| ⋮ | | | | | | |
| 10 | 10 | 0.77(=$V_{NS1(10,10)}$) | 1.15(=$V_{NS2(10,10)}$) | 1.92(=$V_{NS3(10,10)}$) | 0.77(=$V_{NS4(10,10)}$) | 0.38(=$V_{NS5(10,10)}$) |

FIG. 10C

| | ANTENNA 302 | ANTENNA 303 | ANTENNA 304 | ANTENNA 305 | ANTENNA 306 |
|---|---|---|---|---|---|
| POSITION X | 0.65 (=$V_{Nm1}$) | 0.43 (=$V_{Nm2}$) | 1.01 (=$V_{Nm3}$) | 1.19 (=$V_{Nm4}$) | 1.73 (=$V_{Nm5}$) |

CHARGED PARTICLE BEAM SYSTEM

BACKGROUND OF THE INVENTION

1. Field of the Invention

The present invention relates to a charged particle beam system.

2. Description of the Related Art

A charged particle device includes a high voltage portion or a high voltage charged portion, and a discharge may be generated from this portion to other portions. When a large number of times of discharges accumulate, the charged particle device may be affected. Therefore, it is necessary to detect where the discharge is generated in the charged particle device.

For example, JP-A-2006-250870 (Japanese Patent No. 4450749; Patent Literature 1) and JP-A-2010-085386 (Japanese Patent No. 5306802; Patent Literature 2) describe techniques of detecting a position where the discharge is generated.

SUMMARY OF THE INVENTION

However, the problem unique to a charged particle beam device that it is necessary to detect the position where the discharge is generated since when a large number of times of discharges accumulate in the charged particle beam device, the device is affected and a solution thereof are not mentioned in Patent Literature 1 and Patent Literature 2.

In the configuration of Patent Literature 1, a high-precision local oscillator is necessary, and the cost is increased. In the configuration of Patent Literature 2, a high-speed analog-to-digital converter is necessary, and the cost is increased.

An object of the invention is to detect a position where the discharge is generated with a simple configuration in the charged particle beam device.

A charged particle beam system according to one aspect of the invention includes a charged particle beam device and a detection circuit connected to the charged particle beam device, in which the charged particle beam device includes: a first antenna which has a first resonant frequency; and a second antenna which has a second resonant frequency different from the first resonant frequency, and the detection circuit includes: an amplification unit which amplifies antenna signals received by the first antenna and the second antenna; a first filter through which a signal of the first resonant frequency of the first antenna from the signal amplified by the amplification unit passes; a second filter through which a signal of the second resonant frequency of the second antenna from the signal amplified by the amplification unit passes; a first amplitude detection unit which detects a first amplitude of a signal after passing through the first filter; a second amplitude detection unit which detects a second amplitude of a signal after passing through the second filter; and an amplitude comparison unit which compares the first amplitude detected by the first amplitude detection unit with the second amplitude detected by the second amplitude detection unit.

A charged particle beam system according to one aspect of the invention includes a charged particle beam device and a detection circuit connected to the charged particle beam device, in which the charged particle beam device includes: a first antenna which has a first resonant frequency; and a second antenna which has a second resonant frequency different from the first resonant frequency, and the detection circuit includes: an amplification unit which amplifies antenna signals received by the first antenna and the second antenna; a first filter through which a signal of the first resonant frequency of the first antenna from the signal amplified by the amplification unit passes; a second filter through which a signal of the second resonant frequency of the second antenna from the signal amplified by the amplification unit passes; a first amplitude detection unit which detects a first amplitude of a signal after passing through the first filter; a second amplitude detection unit which detects a second amplitude of a signal after passing through the second filter; a storage unit which stores in advance a first discharge voltage pattern which is created corresponding to the first amplitude of the first antenna and the second amplitude of the second antenna when a discharge is generated in the charged particle beam device for each of a plurality of discharge positions; and a discharge position determination unit which compares an actual measured discharge voltage pattern during discharge which includes the first amplitude actually detected by the first amplitude detection unit and the second amplitude actually detected by the second amplitude detection unit with a plurality of the first discharge voltage patterns stored in advance in the storage unit for each of the discharge positions, and determines a discharge generation position where the discharge is actually generated.

According to one aspect of the invention, the position where the discharge is generated can be detected with a simple configuration in the charged particle beam device.

BRIEF DESCRIPTION OF THE DRAWINGS

FIG. 10A is a diagram showing an example of a table of detected voltage patterns in each antenna for each of the discharge positions.

FIG. 10B is a diagram showing an example of a table of detected voltage patterns for each coordinate of a moving stage when a discharge is generated on the stage.

FIG. 10C is a diagram showing an example of a table of measured detected voltage patterns.

DESCRIPTION OF EMBODIMENTS

Hereinafter, embodiments will be described with reference to the drawings.

First Embodiment

A configuration example of a charged particle beam system according to a first embodiment will be described with reference to FIG. 1.

Figure 1:
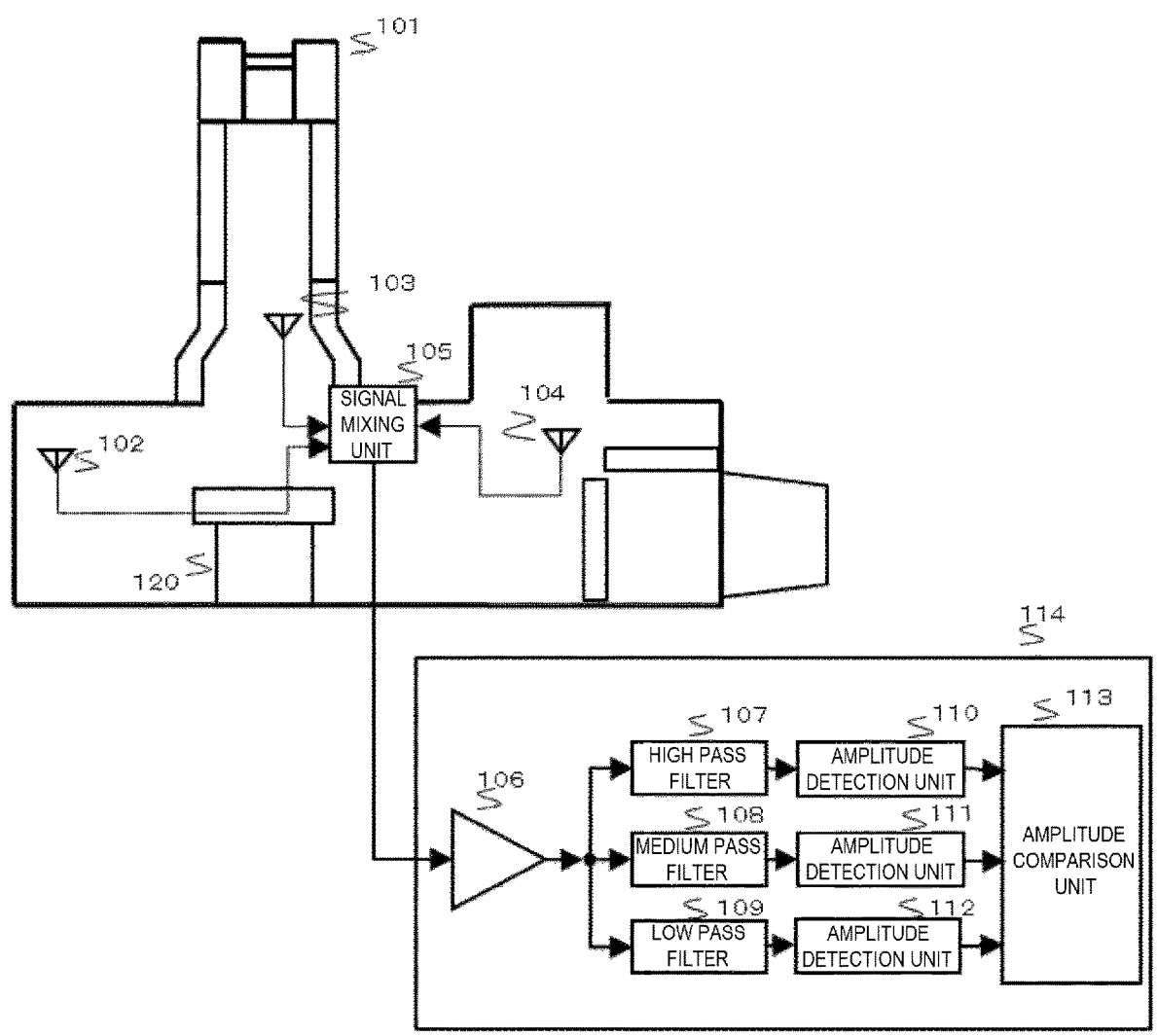
FIG. 1 is a diagram showing a configuration example of a charged particle beam system according to a first embodiment.

As shown in FIG. 1, the charged particle beam system according to the first embodiment includes a charged particle beam device 101 and a detection circuit 114 connected to the charged particle beam device 101.

The charged particle beam device 101 includes a high frequency resonant antenna 102, a medium frequency resonant antenna 103, a low frequency resonant antenna 104, a signal mixing unit 105 which mixes signals of respective antennas, and a moving stage 120 which moves in the device and on which an object to be irradiated with a charged particle beam is placed.

The detection circuit 114 includes an amplification unit 106 which amplifies a signal, and a high pass filter 107, a medium pass filter 108, and a low pass filter 109 which respectively divide amplified signals into signals corresponding to resonant frequency bands of the high frequency resonant antenna 102, the medium frequency resonant antenna 103, and the low frequency resonant antenna 104.

The detection circuit 114 further includes an amplitude detection unit 110, an amplitude detection unit 111, and an amplitude detection unit 112 which respectively detect a signal amplitude after passing through the high pass filter 107, the medium pass filter 108, and the low pass filter 109.

The detection circuit 114 further includes an amplitude comparison unit 113 which compares the detection results of the amplitude detection unit 110, the amplitude detection unit 111, and the amplitude detection unit 112 and performs detection processing.

Next, a detection operation when a discharge is generated will be described.

When a discharge is generated, the high frequency resonant antenna 102, the medium frequency resonant antenna 103, and the low frequency resonant antenna 104 receive electromagnetic waves generated by the discharge. The high frequency resonant antenna 102, the medium frequency resonant antenna 103, and the low frequency resonant antenna 104 have different resonant frequencies and have different frequencies having sensitivity with respect to an electromagnetic wave frequency generated by the discharge.

Since the electromagnetic wave generated by the discharge attenuates and the amplitude thereof decreases as a propagation distance increases, an antenna closest to a place where the discharge is generated receives a signal having an amplitude larger than other antennas. In addition, a farthest antenna receives a signal having an amplitude smaller than other antennas. Received signals of the high frequency resonant antenna 102, the medium frequency resonant antenna 103, and the low frequency resonant antenna 104 are mixed by the signal mixing unit 105 and the mixed signal is output to the detection circuit 114.

In the detection circuit 114, the amplification unit 106 amplifies the received signal, and the amplified signal is filtered by each of the high pass filter 107, the medium pass filter 108, and the low pass filter 109. After that, the amplitudes are detected by the amplitude detection unit 110, the amplitude detection unit 111, and the amplitude detection unit 112, and are compared by the amplitude comparison unit 113.

As described above, since the amplitude of the resonant frequency of the antenna closest to the place where the discharge is generated is the largest, it is determined that the discharge is generated close to the antenna corresponding to the frequency of the largest amplitude based on the comparison results of the amplitude comparison unit 113.

Figure 2A:
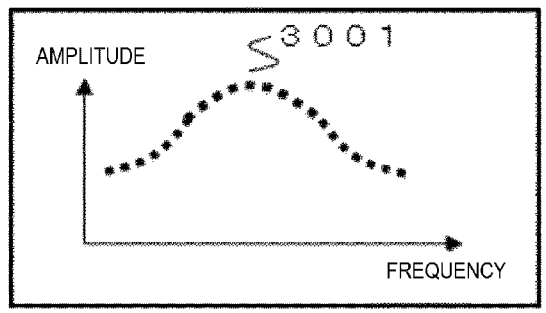
FIG. 2A is a diagram showing a frequency spectrum of a discharge electromagnetic wave.
Figure 2B:
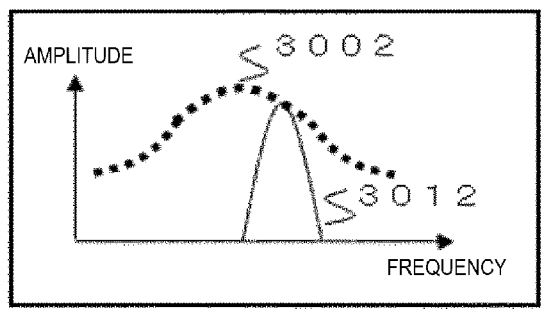
FIG. 2B is a diagram showing frequency spectrums of a discharge electromagnetic wave and a received signal of each antenna.

Here, FIG. 2A shows a frequency spectrum 3001 of a discharge electromagnetic wave. The discharge electromagnetic wave is a signal having a band. FIG. 2B shows a frequency spectrum 3002 of the discharge electromagnetic wave at a position of the high frequency resonant antenna 102 and frequency spectrum 3012 of a received signal of the high frequency resonant antenna 102.

Figure 2C:
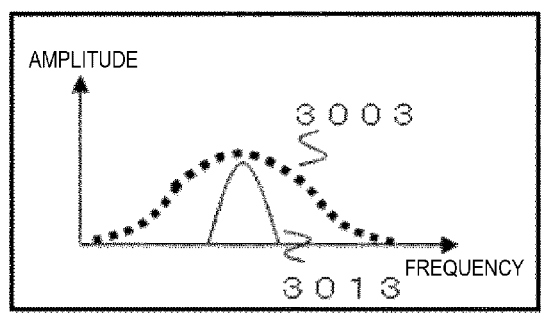
FIG. 2C is a diagram showing frequency spectrums of a discharge electromagnetic wave and a received signal of each antenna.
Figure 2D:
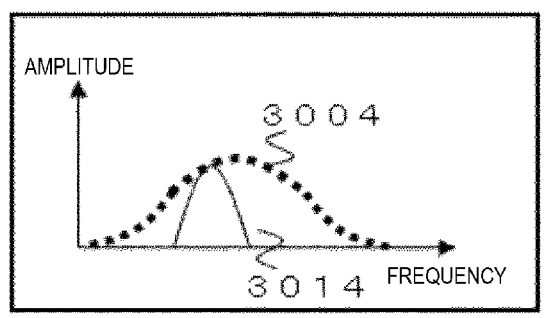
FIG. 2D is a diagram showing frequency spectrums of a discharge electromagnetic wave and a received signal of each antenna.

FIG. 2C shows a frequency spectrum 3003 of the discharge electromagnetic wave at a position of the medium frequency resonant antenna 103 and a frequency spectrum 3013 of a received signal of the medium frequency resonant antenna 103. FIG. 2D shows a frequency spectrum 3004 of the discharge electromagnetic wave at a position of the low frequency resonant antenna 104 and a frequency spectrum 3014 of a received signal of the low frequency resonant antenna 104.

When the discharge is generated close to the high frequency resonant antenna 102, the amplitude of the frequency spectrum 3002 of the discharge electromagnetic wave at the high frequency resonant antenna 102 is the largest in comparison with other amplitudes of the frequency spectrum 3003 and the frequency spectrum 3004.

Therefore, the amplitude of the frequency spectrum 3012 of the received signal of the high frequency resonant antenna 102 is also the largest in comparison with the amplitude of the frequency spectrum 3013 of the received signal of the medium frequency resonant antenna 103 and the amplitude of the frequency spectrum 3014 of the received signal of the low frequency resonant antenna 104. The output values of the amplitude detection unit 110, the amplitude detection unit 111, and the amplitude detection unit 112 correspond to the amplitudes of these received signals. Therefore, the amplitude comparison unit 113 determines that the amplitude at the high frequency resonant antenna 102 is the largest, and detects that the discharge is generated at a position near the high frequency resonant antenna 102.

A configuration example of a circuit of the signal mixing unit 105 will be described with reference to FIG. 3.

Figure 3:
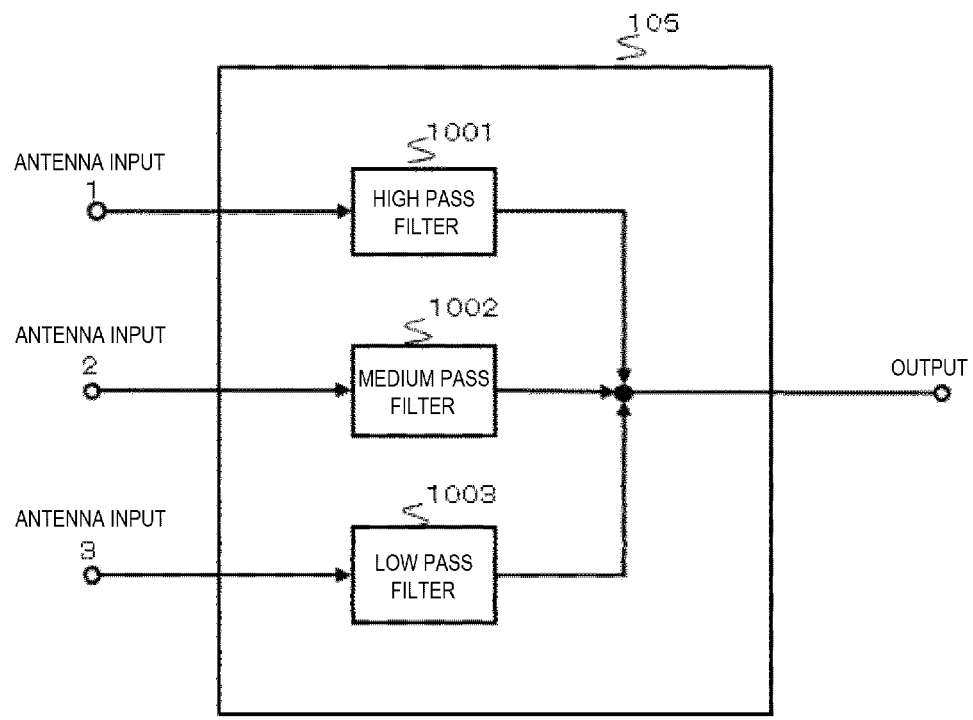
FIG. 3 is a diagram showing a configuration example of a signal mixing unit.

As shown in FIG. 3, the signal mixing unit 105 includes: an input terminal 1, an input terminal 2, and an input terminal 3 which are respectively connected to the high frequency resonant antenna 102, the medium frequency resonant antenna 103, and the low frequency resonant antenna 104; a high pass filter 1001, a medium pass filter 1002, and a low pass filter 1003 which operate so as to pass frequencies corresponding to the resonant frequencies of the high frequency resonant antenna 102, the medium frequency resonant antenna 103, and the low frequency resonant antenna 104 and so as not to flow an antenna signal back to other antennas; and an output terminal which outputs a mixed signal.

A configuration example of the circuit of the amplitude detection unit 110, the amplitude detection unit 111, and the amplitude detection unit 112 will be described with reference to FIG. 4.

Figure 4:
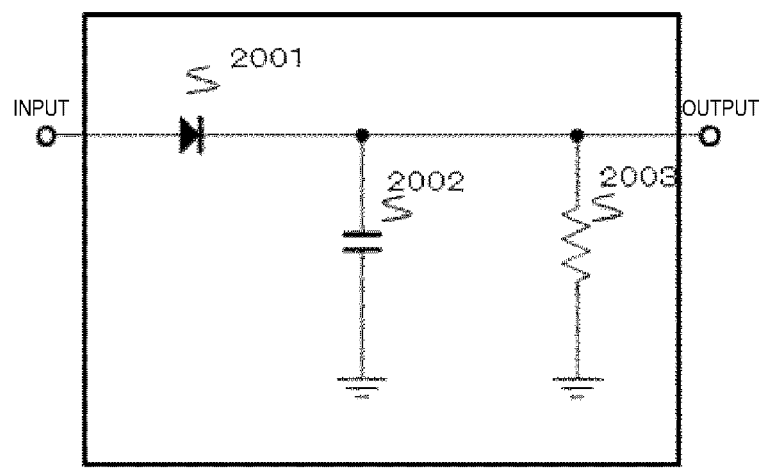
FIG. 4 is a diagram showing a configuration example of an amplitude detection unit.

As shown in FIG. 4, the amplitude detection unit 110, the amplitude detection unit 111, and the amplitude detection unit 112 constitutes a detection circuit, and the detection circuit includes an input terminal of a signal, a diode 2001, a resistor 2003, a capacitor 2002, and an output terminal. It is desirable to use the diode 2001 having a high speed and low VF so that the detection can be performed with a high frequency and minute amplitude.

With such a configuration, it is possible to detect the discharge including detecting the position where the discharge is generated with a simple circuit configuration. In addition, the connection from the signal mixing unit 105 to the detection circuit 114 (detection substrate) can be made as one system, and the handling of a cable can be simplified and thus the cost can be reduced.

In the first embodiment, the number of antennas is three, but the number of antennas is not limited and may be other numbers. In this case, the number of the signal mixing unit 105, the number of the filter 107, the filter 108, and the filter 109, and the number of the amplitude detection unit 110, the amplitude detection unit 111, and the amplitude detection unit 112 correspond to the number of antennas.

A discharge signal has a frequency spectrum having a certain band, but it is desirable that a peak frequency of each antenna be close because a bandwidth thereof is limited.

In addition, in the first embodiment, an example of using the antenna for receiving the discharge electromagnetic wave is shown, but the structure of the charged particle beam device 101 itself, such as the moving stage 120, may be used as the antenna as long as the electromagnetic wave can be received at a specific resonant frequency.

Further, in the first embodiment, an example in which the antenna itself has a steep resonance characteristic is shown, but an antenna having a gentle resonance characteristic may be used to make a filter cutoff characteristic of the signal mixing unit 105 steep and to have a difference in peak frequency of the received signal of each antenna.

Second Embodiment

A configuration example of a charged particle beam system according to a second embodiment will be described with reference to FIG. 5.

The charged particle beam system according to the second embodiment includes a charged particle beam device 201 and a detection circuit 214 connected to the charged particle beam device 201.

Figure 5:
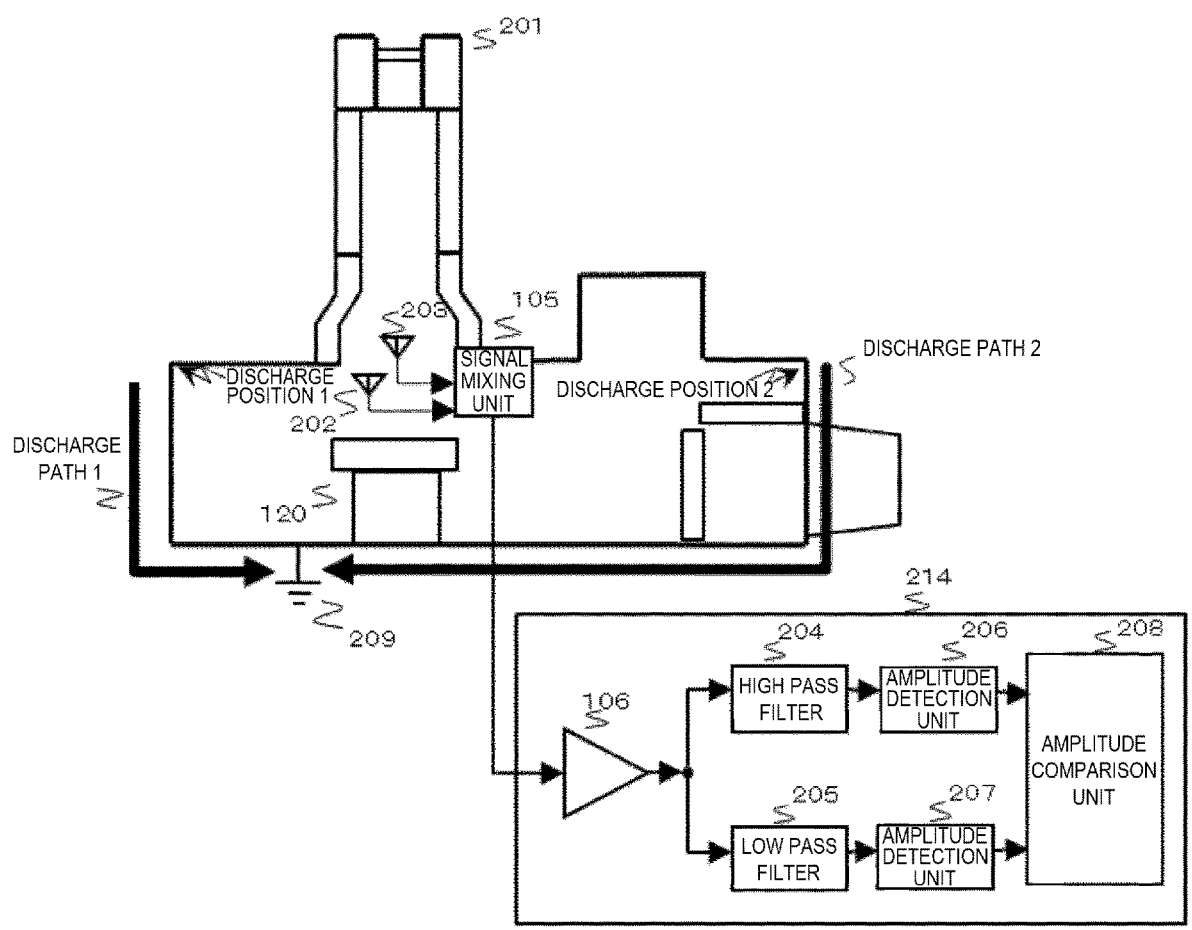
FIG. 5 is a diagram showing a configuration example of a charged particle beam system according to a second embodiment.

As shown in FIG. 5, the charged particle beam device 201 includes a high frequency resonant antenna 202, a low frequency resonant antenna 203, the signal mixing unit 105 which mixes signals of the high frequency resonant antenna 202 and the low frequency resonant antenna 203, and a ground connection unit 209.

The detection circuit 214 includes the amplification unit 106 which amplifies a signal, a high pass filter 204 and a low pass filter 205 which divide the amplified signal for each frequency band, an amplitude detection unit 206 and an amplitude detection unit 207 which detect an amplitude of a signal after passing through the high pass filter 204 and the low pass filter 205, and an amplitude comparison unit 208 which compares the detection results of the amplitude detection unit 206 and the amplitude detection unit 207 and performs detection processing.

Next, a detection operation when a discharge is generated will be described.

A path through which a current generated by the discharge flows changes depending on the place where the discharge is generated. When the discharge is generated at a discharge position 1 in FIG. 5, a discharge current flows from the discharge position 1 toward the ground connection unit 209 through a discharge path 1. When the discharge is generated at a discharge position 2, the current flows from the discharge position 2 toward the ground connection unit 209 through a discharge path 2.

It is known that a peak frequency of the electromagnetic wave generated by the discharge changes depending on the length of the path through which the current flows; when the path is short, the peak frequency is high, and when the path is long, the peak frequency is low. Therefore, when the path is long, a received amplitude is large at the antenna having a low resonant frequency, and when the path is short, the received amplitude is large at the antenna having a high resonant frequency.

Figure 6A:
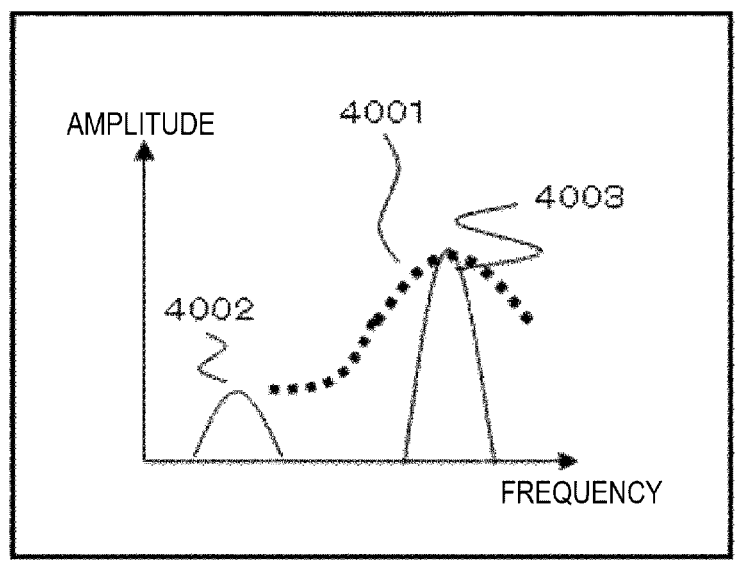
FIG. 6A is a diagram showing frequency spectrums of a discharge electromagnetic wave and received signals of each antenna.

FIG. 6A shows an example of a frequency spectrum 4001 of the discharge electromagnetic wave, a frequency spectrum 4002 of a received signal of the low frequency resonant antenna 203, and a frequency spectrum 4003 of a received signal of the high frequency resonant antenna 202, when the current path is short.

As shown in FIG. 6A, since the peak frequency of the frequency spectrum 4001 of the discharge electromagnetic wave is high when the current path is short, the amplitude of the frequency spectrum 4003 of the received signal of the high frequency resonant antenna 202 is larger than the amplitude of the frequency spectrum 4002 of the received signal of the low frequency resonant antenna 203.

Figure 6B:
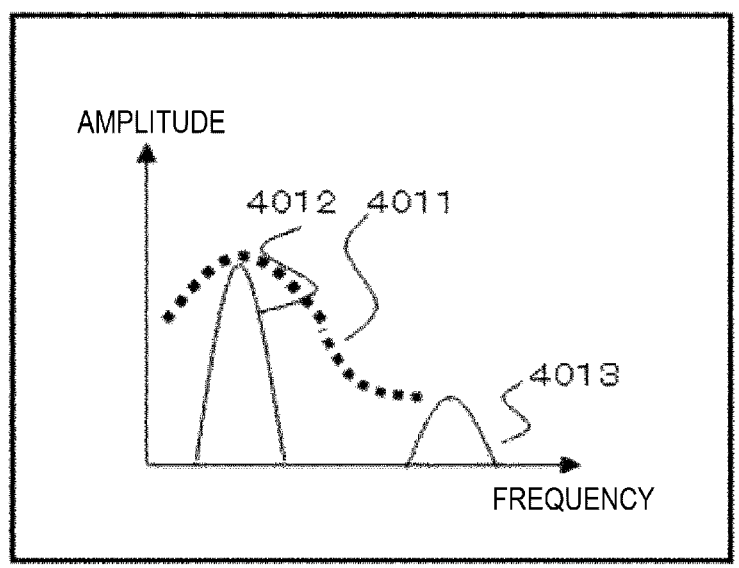
FIG. 6B is a diagram showing frequency spectrums of a discharge electromagnetic wave and the received signals of each antenna.

FIG. 6B shows an example of a frequency spectrum 4011 of the discharge electromagnetic wave, a frequency spectrum 4012 of the received signal of the low frequency resonant antenna 203, and a frequency spectrum 4013 of the received signal of the high frequency resonant antenna 202, when the current path is long.

As shown in FIG. 6B, since the peak frequency of the frequency spectrum 4011 of the discharge electromagnetic wave is low when the current path is long, the amplitude of the frequency spectrum 4012 of the received signal of the low frequency resonant antenna 203 is larger than the amplitude of the frequency spectrum 4013 of the received signal of the high frequency resonant antenna 202.

Therefore, by detecting the amplitudes of the received signals of respective antennas with the amplitude detection unit 206 and the amplitude detection unit 207 after the received signals pass through the high pass filter 204 and the low pass filter 205 and comparing the amplitudes, the length of the path of the discharge current can be known and the discharge position can be detected.

According to the second embodiment, the discharge position can be detected with a simple and low-cost circuit configuration. The configuration of the second embodiment is particularly useful when the number of positions where the discharge is generated is limited.

In the second embodiment, it is desirable to dispose the antenna having a high resonant frequency and the antenna having a low resonant frequency to be adjacent to each other. In the second embodiment, the number of antennas is two, but a plurality of antennas other than two may be used.

Third Embodiment

Figure 7:
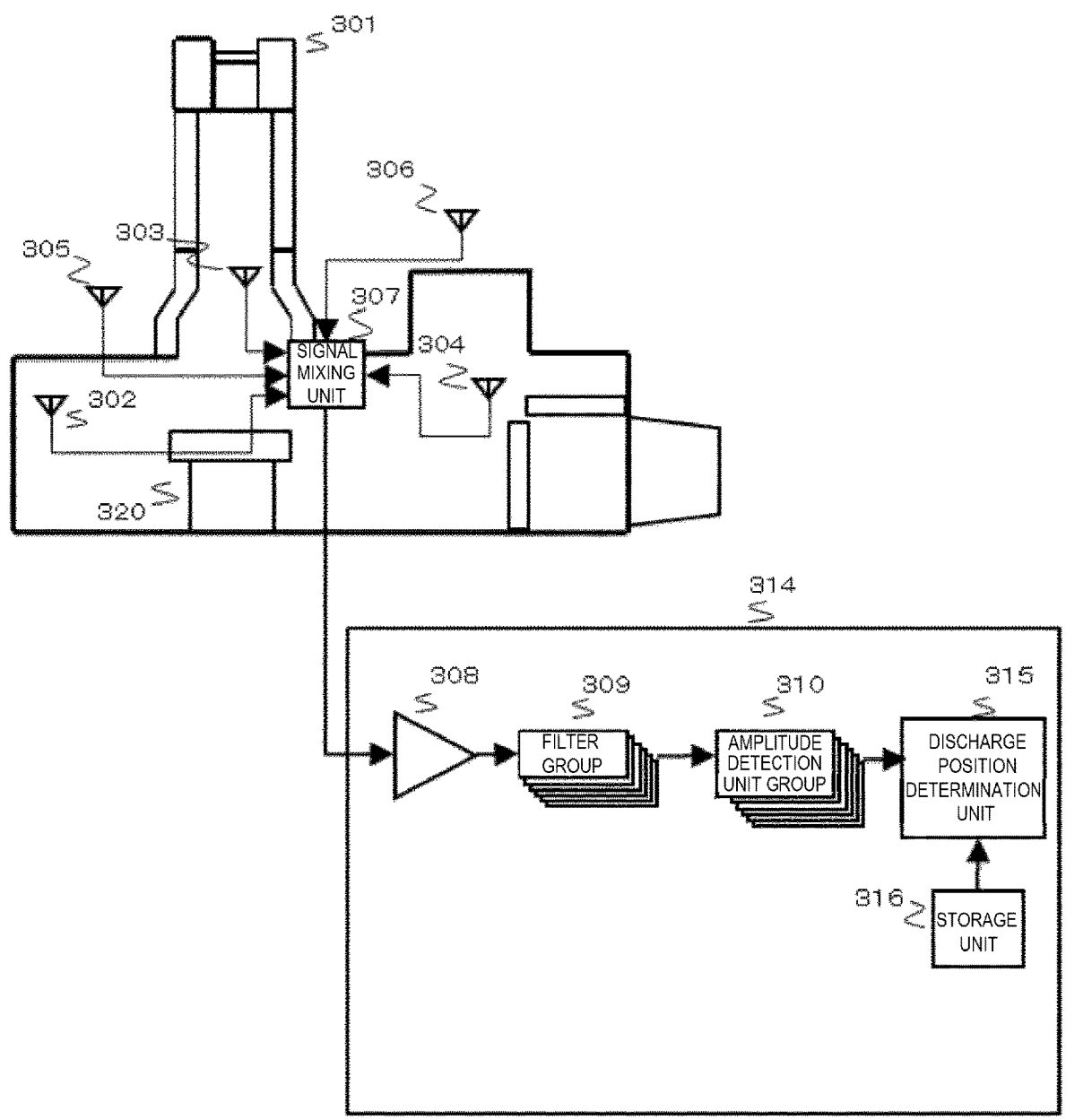
FIG. 7 is a diagram showing a configuration example of a charged particle beam system according to a third embodiment.

A configuration example of a charged particle beam system according to a third embodiment will be described with reference to FIG. 7.

The charged particle beam system according to the third embodiment includes a charged particle beam device 301 and a detection circuit 314 connected to the charged particle beam device 301.

The charged particle beam device 301 includes a high frequency resonant antenna 302, a sub-high frequency (between high frequency and medium frequency) resonant antenna 303, a medium frequency resonant antenna 304, a sub-medium frequency (between medium frequency and low frequency) resonant antenna 305, a low frequency resonant antenna 306 which have different resonant frequencies, a signal mixing unit 307 which mixes signals of respective antennas, and a moving stage 320 which moves in the charged particle beam device 301 and on which an object to be irradiated with a charged particle beam is placed.

The detection circuit 314 includes: an amplification unit 308 which amplifies the signal; a filter group 309 which includes a high pass filter, a sub-high pass filter, a medium pass filter, a sub-medium pass filter and a low pass filter which have different characteristics for dividing the amplified signals for respective frequencies corresponding to the resonant frequencies of respective antennas; an amplitude detection unit group 310 which includes amplitude detection units having the same circuit configuration, having the same number as the filters and detecting the amplitude of the signal after passing through each filter; a discharge position determination unit 315 which determines the discharge position based on the detection results of respective amplitude detection units; and a storage unit 316 which stores detected voltage patterns in advance.

The antenna is not necessary to be provided inside the charged particle beam device 301, and as an example in the third embodiment, the high frequency resonant antenna 302, the sub-high frequency resonant antenna 303, and the medium frequency resonant antenna 304 are provided inside the charged particle beam device 301. The sub-medium frequency resonant antenna 305 and the low frequency resonant antenna 306 are provided outside the charged particle beam device 301.

Next, a detection operation when a discharge is generated will be described.

Figures 8A, 8B, 8C:
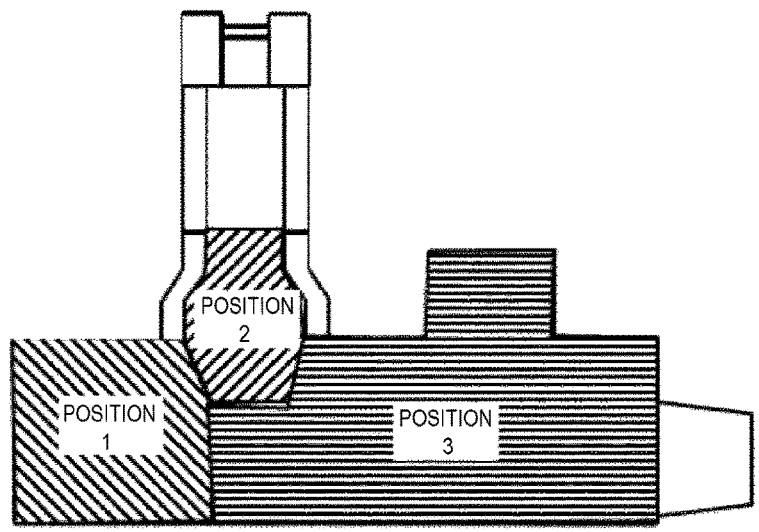
FIG. 8A is a diagram showing an example of a table of detected voltage patterns in each antenna for each of discharge positions.
FIG. 8B is a diagram showing an example of the discharge position.
FIG. 8C is a diagram showing an example of a table of measured detected voltage patterns.

When the discharge is generated artificially in advance at a position 1 shown in FIG. 8B, signals are received at the high frequency resonant antenna 302, the sub-high frequency (between high frequency and medium frequency) resonant antenna 303, the medium frequency resonant antenna 304, the sub-medium frequency (between medium frequency and low frequency) resonant antenna 305, and the low frequency resonant antenna 306. Then, a voltage amplitude detected by the amplitude detection unit group 310 after reception is measured.

At this time, detected voltages at respective antenna positions are set as $V_{11}$, $V_{12}$, $V_{13}$, $V_{14}$, and $V_{15}$. Further, an average value of these voltages is obtained as $V_{1A}=(V_{11}+V_{12}+V_{13}+V_{14}+V_{15})/5$.

Each detected voltage is divided by the average value $V_{1A}$ to obtain a normalized detected voltage as $V_{N11}=V_{11}/V_{1A}$, $V_{N12}=V_{12}/V_{1A}$, $V_{N13}=V_{13}/V_{1A}$, $V_{N14}=V_{14}/V_{1A}$, and $V_{N15}=V_{15}/V_{1A}$.

These normalized detected voltages $V_{N11}$, $V_{N12}$, $V_{N13}$, $V_{N14}$, and $V_{N15}$ are stored as detected voltage patterns in the storage unit 316. The same processing is performed at a position 2 and a position 3, and detected voltage patterns $V_{N21}$, $V_{N22}$, . . . at the position 2 and detected voltage patterns $V_{N31}$, $V_{N32}$, . . . at the position 3 are obtained and stored in the storage unit 316. Here, an example of the normalized detected voltage patterns stored in the storage unit 316 is shown in FIG. 8A.

Figure 11:
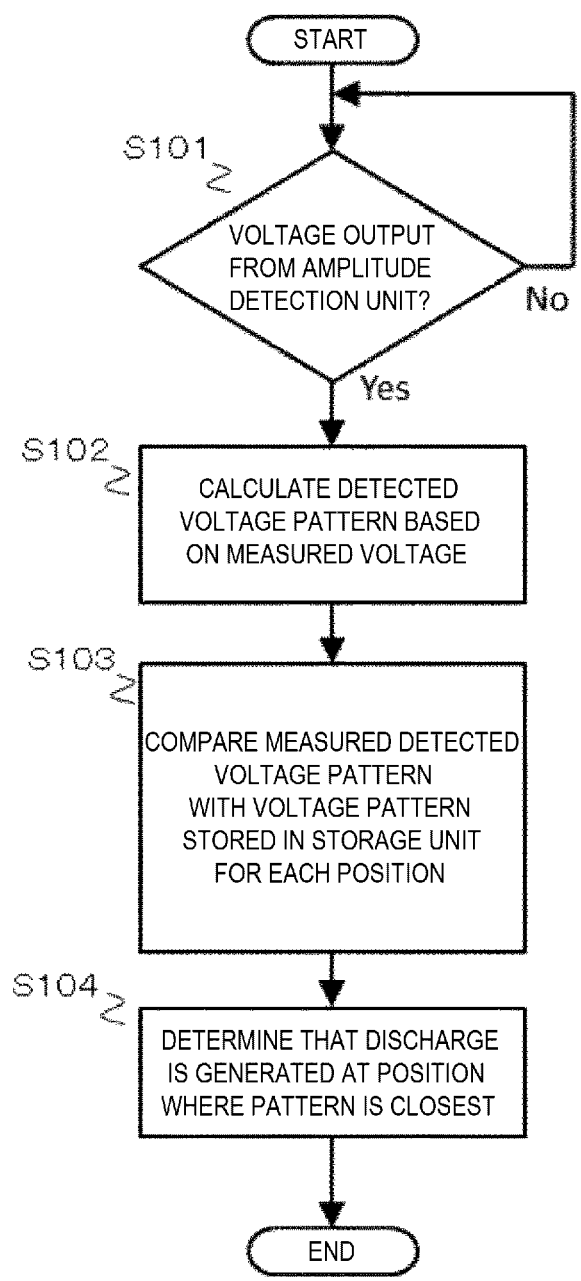
FIG. 11 is a diagram showing an example of a flow of discharge position detection according to the third embodiment.

The operation of detecting the discharge position when the discharge is detected will be described with reference to FIG. 11.

A transmission path of the electromagnetic wave and a distance of the electromagnetic wave to each of the antennas 302 to 306 change depending on the position where the discharge is generated. Therefore, different detected voltage patterns at the positions of the respective antennas 302 to 306 are used.

First, when there is no voltage output from the amplitude detection units of the amplitude detection unit group 310 (S101: No), the discharge position determination unit 315 determines that there is no discharge, and waits until there is a voltage output.

When there is a voltage output, it is determined that the discharge is generated (S101: Yes), the voltage amplitudes measured by the amplitude detection unit group 310 are associated with the respective antennas 302 to 306, and are set as $V_{m1}$, $V_{m2}$, $V_{m3}$, $V_{m4}$, and $V_{m5}$, and the normalized detected voltages are calculated based on these values (S102).

The average value is obtained as $V_{mA}=(V_{m1}+V_{m2}+V_{m3}+V_{m4}+V_{m5})/5$.

The normalized detected voltages are obtained as $V_{Nm1}=V_{m1}/V_{mA}$, $V_{Nm2}=V_{m2}/V_{mA}$, $V_{Nm3}=V_{m3}/V_{mA}$, $V_{Nm4}=V_{m4}/V_{mA}$, and $V_{Nm5}=V_{m5}/V_{mA}$.

These normalized detected voltages are set as measured detected voltage patterns. FIG. 8C shows an example of the measured detected voltage patterns.

Next, the measured detected voltage pattern is compared with the detected voltage pattern at the position 1, the position 2, and the position 3 respectively (S103). For example, the sum of absolute values of the differences between the normalized detected voltages for the respective antennas 302 to 306 is set as a total residual value and as an index of comparison.

Then, the measured detected voltage pattern (see FIG. 8C) and the detected voltage pattern at the position 1 (see FIG. 8A) are compared.

A total residual value $E_1$ is calculated as $E_1 = |V_{N11} - V_{Nm1}| + |V_{N12} - V_{Nm2}| + |V_{N13} - V_{Nm3}| + |V_{N14} - V_{Nm4}| + |V_{N15} - V_{Nm5}|$.

Similarly, a total residual value $E_2$ of the measured detected voltage pattern (see FIG. 8C) and the detected voltage pattern at the position 2 (see FIG. 8A) and a total residual value $E_3$ of the measured detected voltage pattern (see FIG. 8C) and the detected voltage pattern at the position 3 (see FIG. 8A) are calculated, and the position where the value is the smallest is determined as the discharge position (S104). When calculated with the values from FIGS. 8A and 8C, it is obtained as $E_1=4$, $E_2=2.75$, and $E_3=0.38$, and it is determined that the discharge is generated at the position 3.

That is, in S104, as a result of the comparison in S103, it is determined that the discharge is generated at a position where the detected voltage pattern (see FIG. 8A) is closest to the measured detected voltage pattern (see FIG. 8C).

As described above, first discharge voltage patterns (see FIG. 8A) which are created corresponding to the amplitudes of the respective antennas 302 to 306 when the discharge is generated in the charged particle beam device 301 for each of a plurality of discharge positions (the position 1, the position 2, and the position 3 in FIG. 8A), and are stored in advance in the storage unit 316.

The discharge position determination unit 315 compares an actual measured discharge voltage pattern (see FIG. 8C) during discharge which includes a first amplitude actually detected by a first amplitude detection unit of the amplitude detection unit group 310 and a second amplitude actually detected by a second amplitude detection unit with a plurality of first discharge voltage patterns (see FIG. 8A) stored in advance in the storage unit 316 for each of the discharge positions (the position 1, the position 2, and the position 3 in FIG. 8A), and determines a discharge generation position where the discharge is actually generated.

At this time, the discharge position determination unit 315 compares the actually measured discharge voltage patterns (see FIG. 8C) with the first discharge voltage patterns (see FIG. 8A) for each of the discharge positions (the position 1, the position 2, and the position 3 in FIG. 8A), and determines a discharge position where a voltage pattern is the most approximate as the discharge generation position.

Accordingly, even when there is a shield between the discharge position and the antenna, or when there is a complicated transmission path between the discharge position and the antenna, the discharge position can be detected more accurately.

When the charged particle beam device 301 is in vacuum, it is necessary to make the material of the antenna be vacuum compatible, which is costly. In contrast, in the configuration of the third embodiment, the discharge position can be detected even when the antenna is provided outside the charged particle beam device 301. Therefore, the cost can be reduced.

Even when there are a plurality kinds of charged particle beam devices 301 having different shapes, it is possible to deal with devices having various shapes if a table of detected voltage patterns is created for each shape.

In the third embodiment, the number of antennas is five, but a plurality of antennas other than five may be used. In addition, in the third embodiment, the discharge position is set as three positions of the position 1, the position 2, and the position 3, but the number of positions may be two or four or more.

Further, in the third embodiment, the value of the detected voltage pattern which is a value normalized by the average value of the detected voltage is used, but may be a value calculated by another calculation. Further, the sum of the absolute values of the differences between the normalized detected voltages corresponding to respective antennas is used as the index for comparison of patterns, but other values may be used as the index for comparison.

Fourth Embodiment

Figure 9:
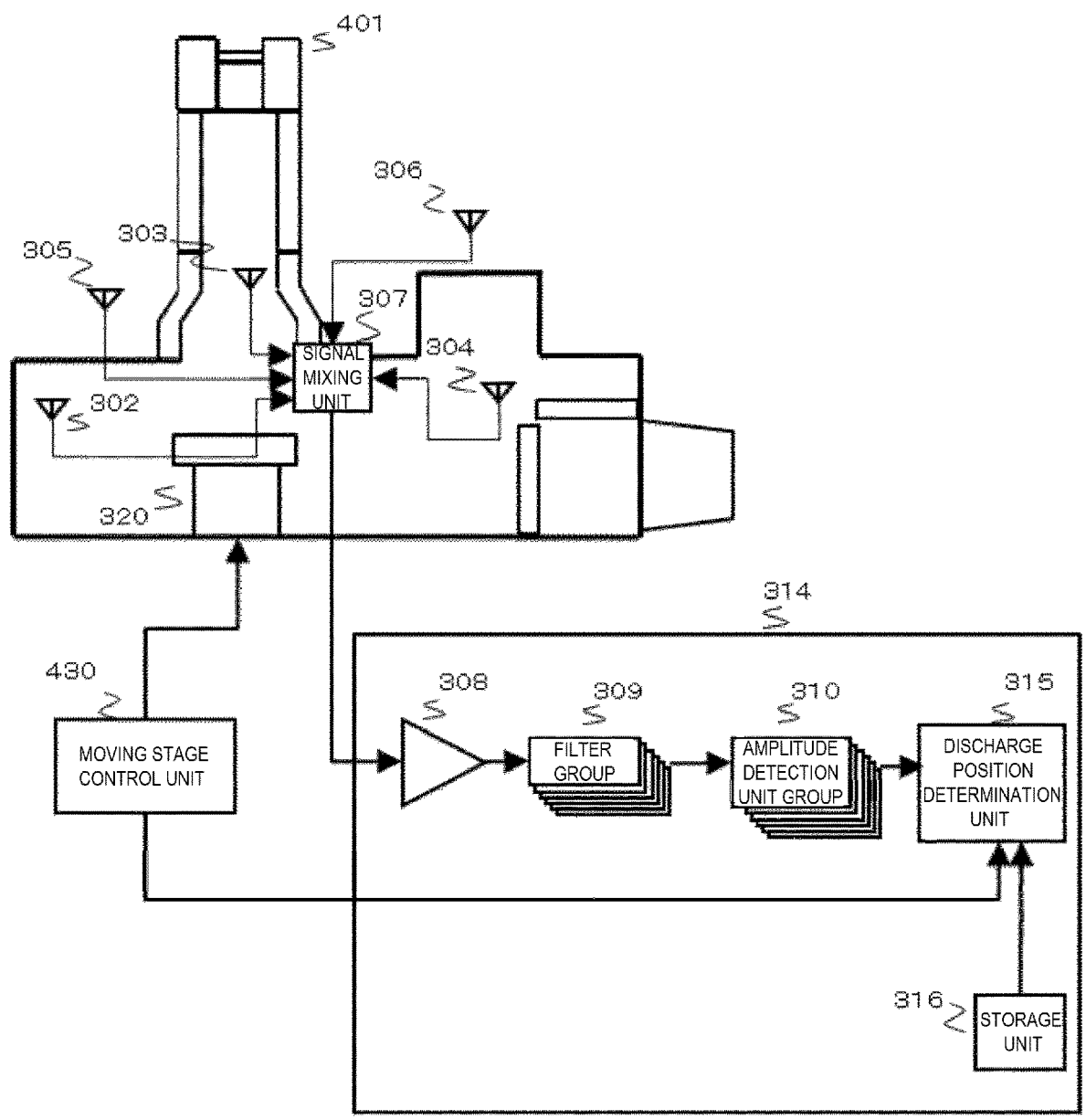
FIG. 9 is a diagram showing a configuration example of a charged particle beam system according to a fourth embodiment.

A configuration example of a charged particle beam system according to a fourth embodiment will be described with reference to FIG. 9.

The charged particle beam system according to the fourth embodiment includes a charged particle beam device 401, the detection circuit 314 connected to the charged particle beam device 401, and a moving stage control unit 430. The moving stage control unit 430 is connected to the charged particle beam device 401 and the detection circuit 314.

In the fourth embodiment, the discharge position is determined by adding data of X-axis coordinate and Y-axis coordinate of the moving stage 320 in addition to the third embodiment. In addition to the configuration of the third embodiment, the charged particle beam device 401 includes the moving stage control unit 430 which controls the moving stage 320 to move in an X-axis direction and a Y-axis direction and outputs the coordinate position to the discharge position determination unit 315.

First, similarly as in the third embodiment, when the discharge is generated artificially in advance at the position 1, the position 2, and the position 3 respectively shown in FIG. 8B, signals are received at the high frequency resonant antenna 302, the sub-high frequency (between high frequency and medium frequency) resonant antenna 303, the medium frequency resonant antenna 304, the sub-medium frequency (between medium frequency and low frequency) resonant antenna 305, and the low frequency resonant antenna 306. Then, a detected voltage pattern is stored in the storage unit 316 in advance. The calculation formula for obtaining the detected voltage pattern is also the same as in the third embodiment. An example of the detected voltage pattern is shown in FIG. 10A.

Next, when the discharge is generated artificially on the moving stage 320 while changing the X-axis coordinate and the Y-axis coordinate of the moving stage 320, signals are received at the high frequency resonant antenna 302, the sub-high frequency (between high frequency and medium frequency) resonant antenna 303, the medium frequency resonant antenna 304, the sub-medium frequency (between medium frequency and low frequency) resonant antenna 305, and the low frequency resonant antenna 306. Then, the detected voltage pattern is obtained and stored in the storage unit 316 together with the coordinate information of the moving stage 320. An example of the detected voltage pattern when the discharge is generated on the moving stage 320 is shown in FIG. 10B.

Figure 12:
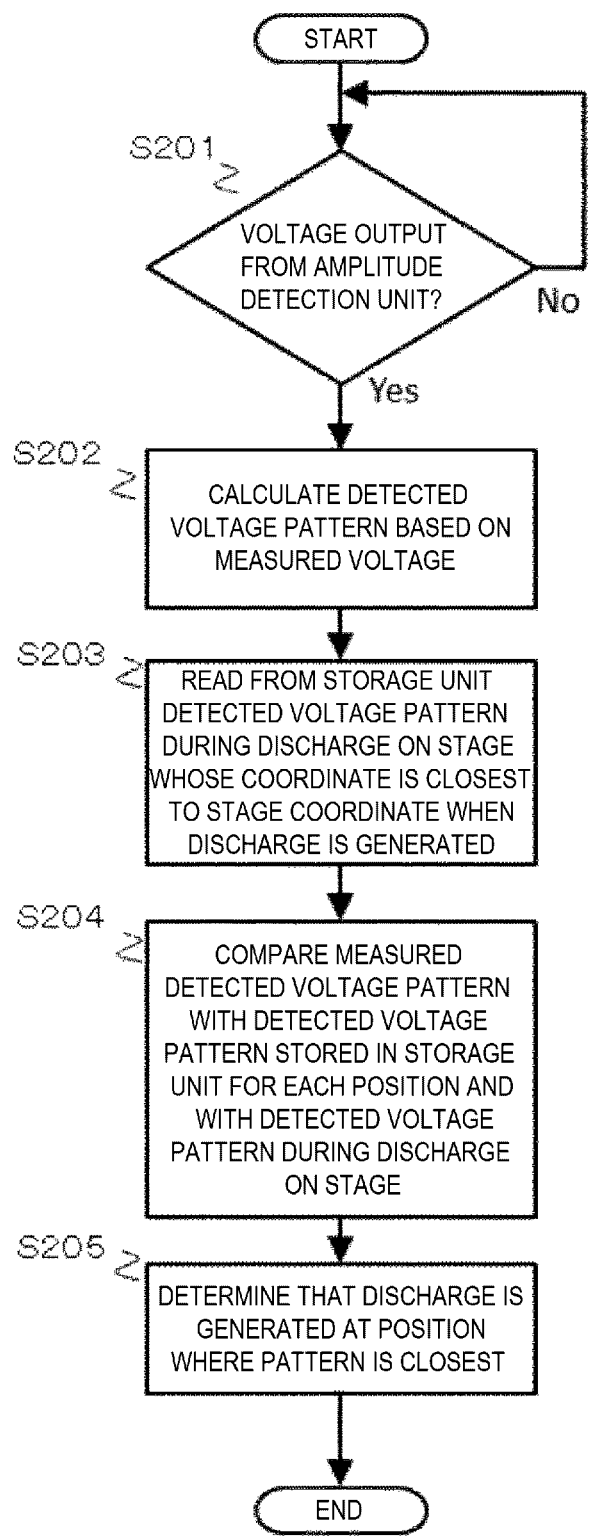
FIG. 12 is a diagram showing an example of a flow of discharge position detection according to the fourth embodiment.

Next, the operation of detecting the discharge position when the discharge is detected will be described with reference to FIG. 12.

First, when there is no voltage output from the amplitude detection units of the amplitude detection unit group 310 (S201: No), the discharge position determination unit 315 determines that there is no discharge, and waits until there is a voltage output. When there is a voltage output, it is determined that the discharge is generated (S201: Yes).

When it is determined that the discharge is generated, the voltage amplitudes measured by the amplitude detection unit group 310 are associated with the high frequency resonant antenna 302, the sub-high frequency (between high frequency and medium frequency) resonant antenna 303, the medium frequency resonant antenna 304, the sub-medium frequency (between medium frequency and low frequency) resonant antenna 305, and the low frequency resonant antenna 306, and are set as $V_{m1}$, $V_{m2}$, $V_{m3}$, $V_{m4}$, and $V_{m5}$, and the normalized detected voltages are calculated based on these values similarly as in the third embodiment, to obtain measured detected voltage patterns (S202). Here, FIG. 10C shows an example of the measured detected voltage patterns.

Next, the discharge position determination unit 315 acquires the X-axis coordinate and the Y-axis coordinate of the moving stage 320 when the discharge is generated from the moving stage control unit 430, and reads a detected voltage pattern, when the discharge is generated on the moving stage 320, whose coordinate is closest to the X-axis coordinate and the Y-axis coordinate from the table of FIG. 10B stored in the storage unit 316 (S203).

The measured detected voltage patterns (see FIG. 10C) are compared with the detected voltage patterns at the position 1, the position 2, and the position 3 (see FIG. 10A) and with the detected voltage patterns when the discharge is generated on the moving stage 320 read in S203 (see FIG. 10B) (S204).

As a result of the comparison in S204, it is determined that the discharge is generated at a position where the detected voltage pattern is closest to the measured detected voltage pattern (see FIG. 10C) (S205).

In summary, first, the first discharge voltage patterns (see FIG. 10A) which are created corresponding to the amplitudes of the respective antennas 302 to 306 when the discharge is generated in the charged particle beam device 401 for each of a plurality of discharge positions (the position 1, the position 2, and the position 3 in FIG. 10A), and are stored in advance in the storage unit 316.

Further, the second discharge voltage patterns (see FIG. 10B) which are created corresponding to the amplitudes of the respective antennas 302 to 306 when the discharge is generated on the moving stage 320 for each of a plurality of position coordinates of the moving stage 320 using the moving stage control unit 430, and are stored in advance in the storage unit 316.

The discharge position determination unit 315 compares an actual measured discharge voltage pattern (see FIG. 10C) during discharge which includes the first amplitude to a fifth amplitude actually detected by the first amplitude detection unit to a fifth amplitude detection unit of the amplitude detection unit group 310 with a plurality of first discharge voltage patterns (see FIG. 10A) stored in advance in the storage unit 316 and with a plurality of second discharge voltage patterns (see FIG. 10B) corresponding to the coordinates of the moving stage during discharge for each of the discharge positions (discharge voltage patterns at the position 1, the position 2, and the position 3 in FIG. 10A and discharge voltage patterns corresponding to the coordinates of the moving stage during discharge in FIG. 10B), and determines a discharge generation position where the discharge is actually generated.

At this time, the discharge position determination unit 315 compares the actually measured discharge voltage pattern (see FIG. 10C) with the first discharge voltage patterns (see FIG. 10A) and with the second discharge voltage patterns (see FIG. 10B) corresponding to the coordinates of the moving stage during discharge for each of the discharge positions (discharge voltage patterns at the position 1, the position 2, and the position 3 in FIG. 10A and discharge voltage patterns corresponding to the coordinates of the moving stage during discharge in FIG. 10B), and determines a discharge position where the voltage pattern is the most approximate as the discharge generation position.

As described above, after determining that the discharge is generated as Yes in S201, the detected voltage pattern measured in S202 is calculated to obtain the value shown in FIG. 10C. Then, the coordinate of the moving stage 320 when the discharge is generated is acquired in S203. For example, when the X-axis coordinate is 5 and the Y-axis coordinate is 0, as shown in FIG. 10B, the detected voltage pattern when the discharge is generated on the moving stage 320 is acquired as $V_{NS1(5,\ 0)}=1.33$, $V_{NS2(5,\ 0)}=0.67$, $V_{NS3(5,\ 0)}=1.67$, $V_{NS4(5,\ 0)}=0.67$, and $V_{NS5(5,\ 0)}=0.67$.

After that, in S204, the detected voltage pattern measured and calculated in S202 is compared with the detected voltage pattern at each position corresponding to the positions in FIG. 10A and with the detected voltage pattern corresponding to the position coordinate of the moving stage 320 read in S203.

Similarly as in the third embodiment, the sum of absolute values of the differences between the normalized detected voltages for respective antennas is set as a total residual value and as an index of comparison. The total residual values between the measured detected voltage patterns and the patterns at the position 1, the position 2, and the position 3 are set as $E_1$, $E_2$, and $E_3$ respectively, and the total residual value between the detected voltage pattern on the stage and the measured detected voltage patterns is set as $E_S$. Then, when the calculation is performed similarly as in the third embodiment, it is obtained that $E_1=2.82$, $E_2=0.96$, $E_3=3.02$, and $E_S=0.46$, and when the values are compared, it is determined that the discharge is generated on the moving stage 320 since the $E_S$ is the smallest value (S205).

According to the fourth embodiment, by adding information of the coordinate of the moving stage 320, the discharge position can also be detected on the moving stage 320 which moves in the charged particle beam device 401 during discharge.

In the fourth embodiment, the moving stage 320 is described as an example, but the same processing may be performed on another structure which moves in the charged particle beam device 401 such as an arm which carries a sample, for example.

What is claimed is:

1. A charged particle beam system comprising:
a charged particle beam device; and
a detection circuit connected to the charged particle beam device, wherein
the charged particle beam device comprises
a first antenna which has a first resonant frequency; and
a second antenna which has a second resonant frequency different from the first resonant frequency, and
the detection circuit comprises
an amplification unit which amplifies antenna signals received by the first antenna and the second antenna;
a first filter through which a signal of the first resonant frequency of the first antenna from the signal amplified by the amplification unit passes;

a second filter through which a signal of the second resonant frequency of the second antenna from the signal amplified by the amplification unit passes;

a first amplitude detection unit which detects a first amplitude of a signal after passing through the first filter; and a second amplitude detection unit which detects a second amplitude of a signal after passing through the second filter, wherein the detection circuit is configured to compare the first amplitude detected by the first amplitude detection unit with the second amplitude detected by the second amplitude detection unit.

2. The charged particle beam system according to claim 1, wherein the charged particle beam device is further configured to mix the antenna signals received by the first antenna and the second antenna, the charged particle beam device is connected to the detection circuit via a cable, and the amplification unit receives, via the cable, the mixed antenna signal output by the charged particle beam device.

3. The charged particle beam system according to claim 1, wherein the charged particle beam further comprises a moving stage, which moves in the device and on which an object to be irradiated is placed.

4. The charged particle beam system according to claim 1, wherein the first antenna has the first resonant frequency corresponding to a first discharge current path, and the second antenna has the second resonant frequency corresponding to a second discharge current path different from the first discharge current path.

5. The charged particle beam system according to claim 4, wherein the charged particle beam device further includes a connection to ground, a length of the first discharge current path is different from a length of the second discharge current path, when a discharge is generated at a first discharge position, a discharge current flows from the first discharge position toward the ground connection through the first discharge current path, and when the discharge is generated at a second discharge position different from the first discharge position, the discharge current flows from the second discharge position toward the ground connection through the second discharge current path.

6. A charged particle beam system comprising:
a charged particle beam device; and
a detection circuit connected to the charged particle beam device, wherein
the charged particle beam device comprises
    a first antenna which has a first resonant frequency; and
    a second antenna which has a second resonant frequency different from the first resonant frequency, and
the detection circuit comprises
    an amplification unit which amplifies antenna signals received by the first antenna and the second antenna;
    a first filter through which a signal of the first resonant frequency of the first antenna from the signal amplified by the amplification unit passes;
    a second filter through which a signal of the second resonant frequency of the second antenna from the signal amplified by the amplification unit passes;
    a first amplitude detection unit which detects a first amplitude of a signal after passing through the first filter; and
    a second amplitude detection unit which detects a second amplitude of a signal after passing through the second filter,
wherein the detection circuit is configured to determine a discharge position by comparing an actual measured discharge voltage pattern during discharge which includes the first amplitude actually detected by the first amplitude detection unit and the second amplitude actually detected by the second amplitude detection unit with a plurality of stored first discharge voltage patterns for each of the discharge positions, and determines a discharge generation position where the discharge is actually generated,
wherein each said first discharge voltage pattern corresponds to the first amplitude of the first antenna and the second amplitude of the second antenna when a discharge is generated in the charged particle beam device for each of the plurality of stored first discharge positions.

7. The charged particle beam system according to claim 6, wherein
the detection circuit is further configured to determine the discharge position by comparing the actually measured discharge voltage pattern with the first discharge voltage pattern for each of the discharge positions, and to determine a discharge position where a voltage pattern is the most approximate as the discharge generation position.

8. The charged particle beam system according to claim 6, further comprising:
a moving stage,
wherein the detection circuit is further configured to determine the discharge position by selecting a pattern corresponding to the position coordinate of the moving stage from a plurality of stored second discharge voltage patterns, to compare the selected pattern and the first discharge voltage pattern with the actually measured discharge voltage pattern, and to determine the discharge generation position,
wherein the stored second discharge voltage pattern corresponds to the first amplitude of the first antenna and the second amplitude of the second antenna when the discharge is generated on the moving stage for each of a plurality of position coordinates of the moving stage.

9. The charged particle beam system according to claim 8, wherein
the moving stage moves in the charged particle beam device and holds an object to be irradiated, and
the detection circuit is configured to determine the discharge position based on the position coordinates of the moving stage.

10. The charged particle beam system according to claim 6, wherein at least one of the first antenna and the second antenna is provided outside the charged particle beam device.

* * * * *